(12) United States Patent
Eby

(10) Patent No.: US 9,002,004 B2
(45) Date of Patent: Apr. 7, 2015

(54) APPENDING PSEUDO-RANDOM SUB-LSB VALUES TO PREVENT INTENSITY BANDING

(75) Inventor: David Eby, Aloha, OR (US)

(73) Assignee: Tektronix, Inc., Beaverton, OR (US)

( * ) Notice: Subject to any disclaimer, the term of this patent is extended or adjusted under 35 U.S.C. 154(b) by 187 days.

(21) Appl. No.: 13/085,678

(22) Filed: Apr. 13, 2011

(65) Prior Publication Data

US 2012/0051538 A1    Mar. 1, 2012

Related U.S. Application Data

(60) Provisional application No. 61/377,804, filed on Aug. 27, 2010.

(51) Int. Cl.
*H04L 9/00*    (2006.01)
*G06F 11/00*    (2006.01)
*G01R 13/02*    (2006.01)
*G01R 15/00*    (2006.01)

(52) U.S. Cl.
CPC .......... *G01R 13/0227* (2013.01); *G01R 15/005* (2013.01)

(58) Field of Classification Search
USPC .......................................... 380/46; 714/25, 30
See application file for complete search history.

(56) References Cited

U.S. PATENT DOCUMENTS 5,703,952 A * 12/1997 Taylor .............................. 380/44
2004/0059999 A1 * 3/2004 Sudoh et al. ................... 715/502
2009/0144595 A1 * 6/2009 Reohr et al. ................... 714/732

* cited by examiner

*Primary Examiner* — Aravind Moorthy
(74) *Attorney, Agent, or Firm* — Michael A. Nelson; Andrew J. Harrington; Marger, Johnson & McCollom, P.C.

(57) ABSTRACT

Embodiments of the present invention provide a test and measurement instrument that displays acquired data on a logarithmic scale without intensity banding. The test and measurement instrument processes the acquired data before it is displayed by appending pseudo-random sub-LSB (least significant bit) values to it. When the processed acquired data is displayed on a logarithmic scale, the pseudo-random sub-LSB values fill in the gaps between discrete power levels, thereby eliminating intensity banding and providing a smooth, visually pleasing display.

10 Claims, 3 Drawing Sheets

APPENDING PSEUDO-RANDOM SUB-LSB VALUES TO PREVENT INTENSITY BANDING

FIELD OF THE INVENTION

The present invention relates to test and measurement instruments, and more particularly to methods of displaying acquired data.

BACKGROUND OF THE INVENTION

Real-time spectrum analyzers such as the RSA6100 and RSA3400 families available from Tektronix, Inc. of Beaverton, Oreg. trigger on, capture, and analyze RF signals in real-time. These test and measurement instruments seamlessly capture RF signals so that, unlike conventional swept spectrum analyzers and vector signal analyzers, no data is missed within a specified bandwidth.

Real-time spectrum analyzers commonly display acquired data on a decibel (dB) scale. A dB scale is calculated as $10 \times \log_{10}(P2/P1)$, where P2 is the power of the signal under test, and P1 is a reference power. However, on a dB scale, low power signals may appear at discrete levels separated by gaps due to the finite resolution of the acquired data and the logarithmic conversion. This display artifact, referred to as "intensity banding," can be very objectionable. As an example, FIG. 1 shows a pulsed RF signal 105 on a dB scale. The pulsed RF signal 105 is represented by 18-bit data, and as a result, power levels below –75 dB appear at discrete levels 110. Intensity banding can be reduced by using more bits to represent the signal under test, for example, by using a higher resolution analog-to-digital converter, however in many cases, a higher resolution analog-to-digital converter is not available or other system considerations limit the number of available bits.

What is desired is a way of displaying acquired data on a logarithmic scale without intensity banding.

SUMMARY OF THE INVENTION

Embodiments of the present invention provide a test and measurement instrument that displays acquired data on a logarithmic scale without intensity banding. The test and measurement instrument processes the acquired data before it is displayed by appending pseudo-random sub-LSB (least significant bit) values to it. When the processed acquired data is displayed on a logarithmic scale, the pseudo-random sub-LSB values fill in the gaps between discrete power levels, thereby eliminating intensity banding and providing a smooth, visually pleasing display.

The objects, advantages, and other novel features of the present invention are apparent from the following detailed description when read in conjunction with the appended claims and attached drawings.

DETAILED DESCRIPTION OF THE INVENTION

Figure 2:
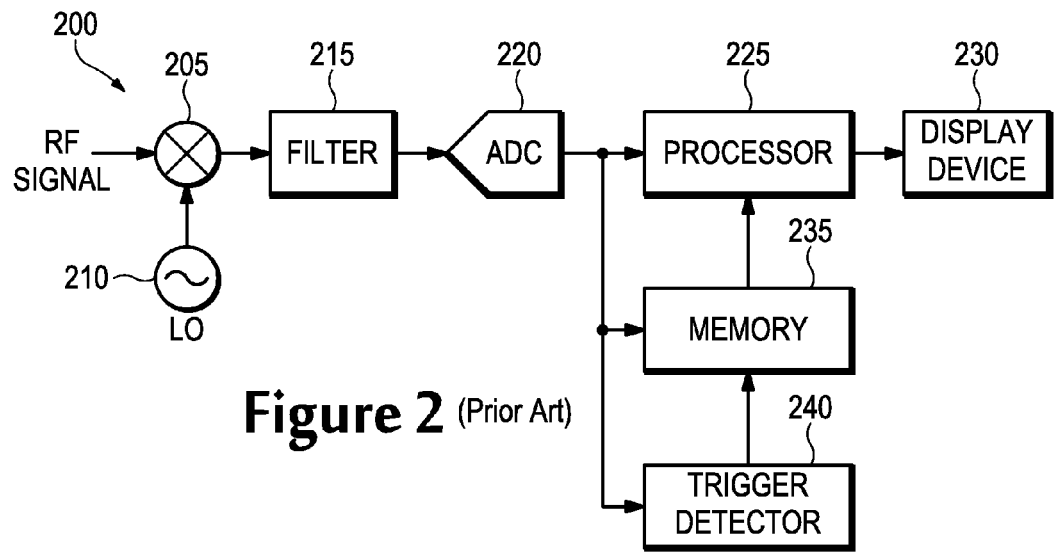
FIG. 2 depicts a high-level block diagram of a conventional real-time spectrum analyzer.

Referring now to FIG. 2, a conventional real-time spectrum analyzer 200 receives a radio frequency (RF) input signal and optionally down-converts it using a mixer 205, local oscillator (LO) 210, and filter 215 to produce an intermediate frequency (IF) signal. An analog-to-digital converter (ADC) 220 digitizes the IF signal to produce a continuous stream of digital data that represents the IF signal. The digital data is then processed in two paths. In the first path, the digital data is input to a processor 225 that analyzes the digital data in real-time. In the second path, the digital data is input to a memory 235 (which, in some embodiments, comprises a circular buffer) and also input to a trigger detector 240 that processes the digital data in real-time and compares the processed data to a user-specified trigger criterion. When the processed digital data satisfies the trigger criterion, the trigger detector 240 generates a trigger signal that causes the memory 235 to store a block of digital data. The processor 225 then analyzes the stored digital data. The processed digital data may be displayed on a display device 230 or stored in a storage device (not shown).

Figure 3:
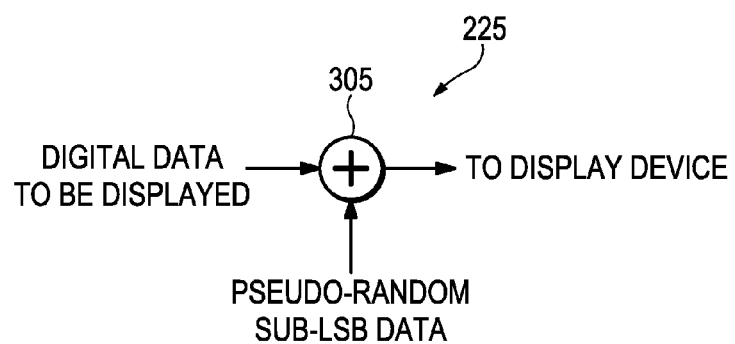
FIG. 3 illustrates how digital data is processed according to an embodiment of the present invention.

Now, in accordance with an embodiment of the present invention, in order to eliminate intensity banding, the processor 225 processes the digital data before it is displayed by appending pseudo-random values to it. The pseudo-random values are sub-LSB (least significant bit), that is, the resolution of the pseudo-random values is less than the LSB of the digital data. This data processing step fills in the gaps between the discrete levels and provides a smooth, visually appealing display. This data processing step is illustrated graphically in FIG. 3, where pseudo-random sub-LSB values are added to digital data before it is displayed.

Figure 1:
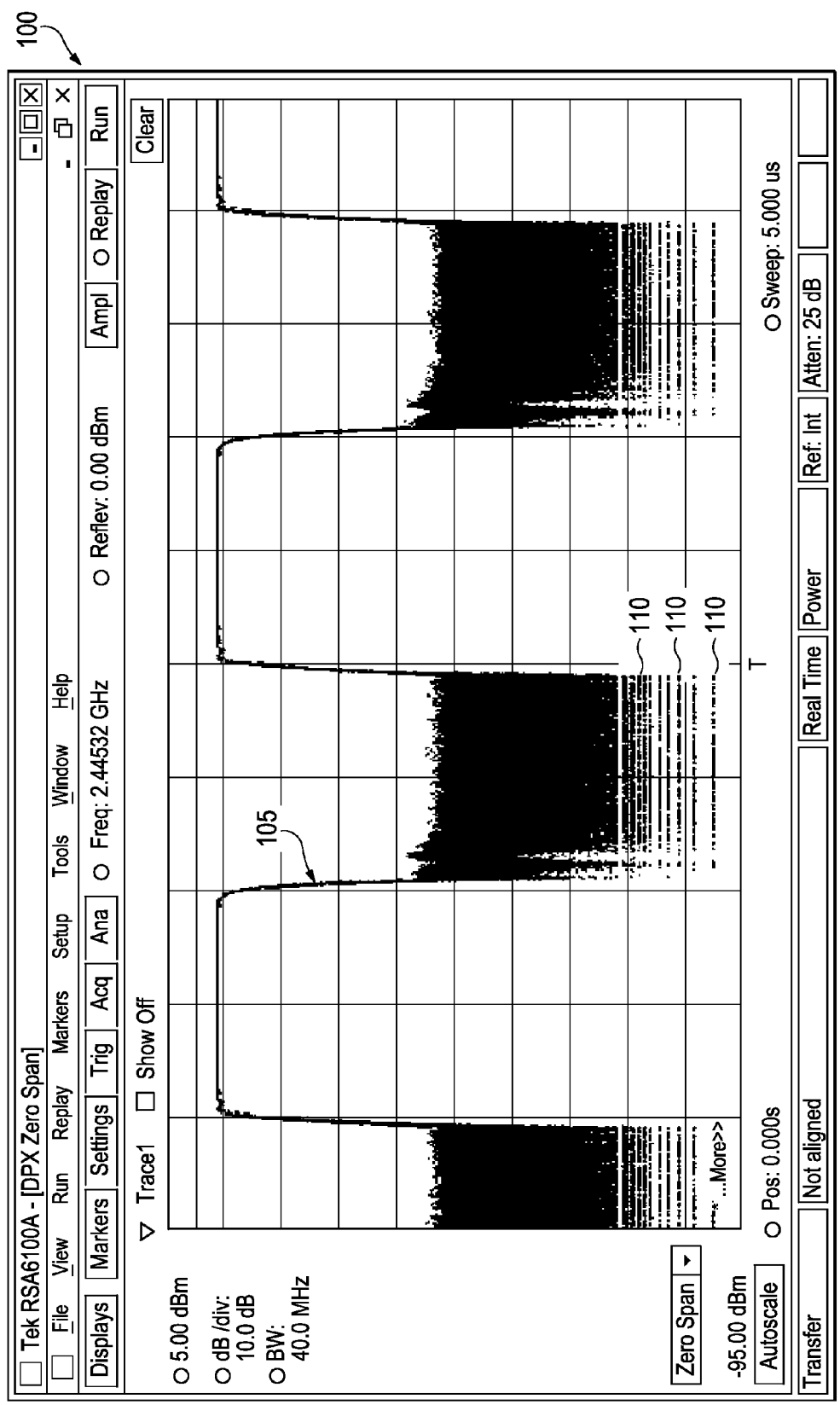
FIG. 1 depicts a conventional time-domain display of a pulsed RF signal.

By way of example, consider one word of 18-bit data, such as one sample of the waveform shown in FIG. 1:

[d17 d16 d15 . . . d02 d01 d00]

Where d00 represents the first bit (or LSB), d01 represents the second bit, and so on.

The 18-bit data above is appended with 8-bits of pseudo-random sub-LSB data, resulting in the 26-bit word shown below:

[d17 d16 d15 . . . d02 d01 d00 . n07 n06 n05 n04 n03 n02 n01 n00]

Where the "." represents a binary point, and n07 . . . n00 represents the 8-bits of pseudo-random sub-LSB values.

Figure 4:
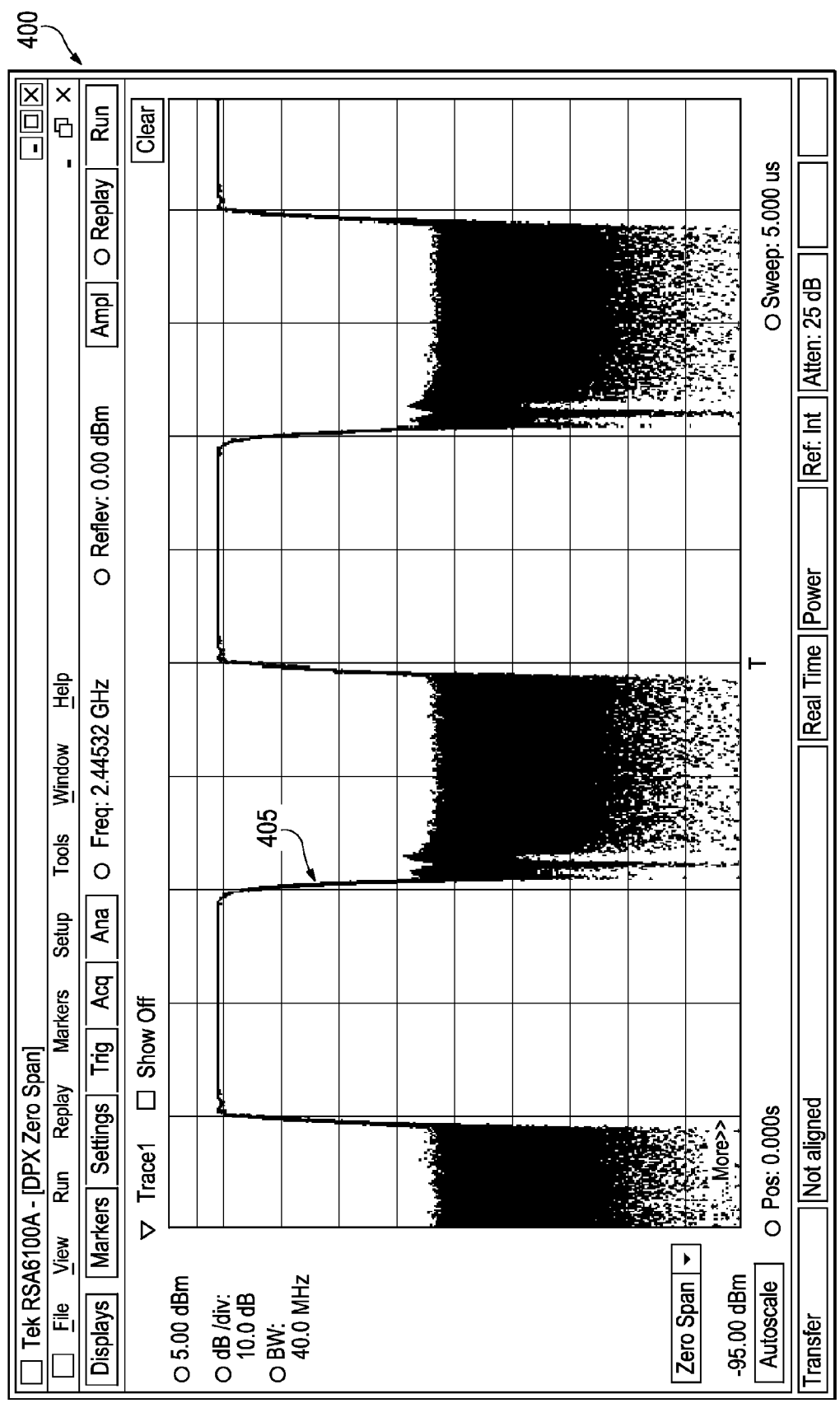
FIG. 4 depicts the pulsed RF signal of FIG. 1 after being processed according to the present invention.

FIG. 4 shows the result of appending 8-bits of pseudo-random sub-LSB data to each sample of the waveform shown in FIG. 1. Note that the intensity banding 110 of FIG. 1 is no longer visually apparent. To be clear, the intensity bands are still present in FIG. 4; the pseudo-random sub-LSB values have only filled in the gaps, thereby providing a smoother, more visually pleasing display.

Preferably, the pseudo-random sub-LSB values have a rectangular distribution, that is, they are evenly distributed between zero and one LSB, in order to provide a smooth transition between discrete power levels on a logarithmic scale. In other embodiments, the pseudo-random sub-LSB values have other distributions such as a Gaussian distribution, a Rayleigh distribution, and the like.

It will be appreciated that the particular numbers of bits described above (i.e., 18-bit acquired data, 8-bit pseudo-random sub-LSB data) are only meant to be illustrative, and that the present invention applies regardless of the particular numbers of bits used.

Although the pseudo-random values are described as being "sub-LSB," in some embodiments, the pseudo-random values span more than one LSB.

Although the present invention is described in terms of a dB scale, it will be appreciated that the present invention can be used to eliminate intensity banding with any type of logarithmic display.

Although the present invention is described as being used in a real-time spectrum analyzer, it will be appreciated that the present invention may also be used in any other test and measurement instrument that displays digitized data on a logarithmic scale such as a swept spectrum analyzer, an oscilloscope, and the like.

Any of the elements of the present invention that operate on digital data may be implemented in hardware, software, or a combination of the two, and may comprise and/or be performed on a general purpose microprocessor, a digital signal processor (DSP), an application specific integrated circuit (ASIC), a field-programmable gate array (FPGA), or the like.

It will be appreciated from the foregoing discussion that the present invention represents a significant advance in the field of test and measurement equipment. Although specific embodiments of the invention have been illustrated and described for purposes of illustration, it will be understood that various modifications may be made without departing from the spirit and scope of the invention. Accordingly, the invention should not be limited except as by the appended claims.

What is claimed is:

1. A test and measurement instrument comprising:
   a processor that appends pseudo-random values to digital data to produce processed digital data, the pseudo-random values having a distribution, and having a resolution that is less than a least significant bit of the digital data; and
   a display device that displays the processed digital data on a logarithmic scale.

2. The test and measurement instrument of claim 1 wherein the processor processes the digital data before it appends the pseudo-random values to it.

3. The test and measurement instrument of claim 1 wherein the distribution of the pseudo-random values spans one least significant bit of the digital data.

4. The test and measurement instrument of claim 1 wherein the distribution of the pseudo-random values spans more than one least significant bit of the digital data.

5. The test and measurement instrument of claim 1 wherein the distribution of the pseudo-random values is a rectangular distribution.

6. A method of displaying digital data comprising the steps of:
   appending pseudo-random values to digital data to produce processed digital data, the pseudo-random values having a distribution, and having a resolution that is less than a least significant bit of the digital data; and
   displaying the processed digital data on a logarithmic scale on a display device.

7. The method of claim 6 wherein the digital data is processed before the pseudo-random values are appended to it.

8. The method of claim 6 wherein the distribution of the pseudo-random values spans one least significant bit of the digital data.

9. The method of claim 6 wherein the distribution of the pseudo-random values spans more than one least significant bit of the digital data.

10. The method of claim 6 wherein the distribution of the pseudo-random values is a rectangular distribution.

* * * * *